(12) United States Patent
Hashimoto

(10) Patent No.: US 11,205,745 B2
(45) Date of Patent: Dec. 21, 2021

(54) LIGHT EMITTING DEVICE

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 6 days.

(21) Appl. No.: 16/711,560

(22) Filed: Dec. 12, 2019

(65) Prior Publication Data
US 2020/0194639 A1 Jun. 18, 2020

(30) Foreign Application Priority Data
Dec. 17, 2018 (JP) .............................. JP2018-235655

(51) Int. Cl.
H01L 33/58 (2010.01)
H01L 33/50 (2010.01)
H01L 33/48 (2010.01)
H01L 33/60 (2010.01)

(52) U.S. Cl.
CPC ............ *H01L 33/58* (2013.01); *H01L 33/486* (2013.01); *H01L 33/505* (2013.01); *H01L 33/60* (2013.01); *H01L 2933/0041* (2013.01); *H01L 2933/0058* (2013.01)

(58) Field of Classification Search
CPC ................. H01L 33/486; H01L 33/60; H01L 2933/0041
See application file for complete search history.

(56) References Cited

U.S. PATENT DOCUMENTS

| 2010/0163898 A1* | 7/2010 | Hung ................ H01L 33/507 257/98 |
| 2012/0305970 A1* | 12/2012 | Kim .................. H01L 33/504 257/98 |
| 2013/0320380 A1 | 12/2013 | Kanemaru |
| 2014/0048821 A1 | 2/2014 | Inoue et al. |
| 2016/0020368 A1 | 1/2016 | Kanemaru |
| 2018/0145232 A1 | 5/2018 | Hashimoto et al. |

FOREIGN PATENT DOCUMENTS

| JP | 2009-158639 A | 7/2009 |
| JP | 2013-118244 A | 6/2013 |
| JP | 2013-143430 A | 7/2013 |
| JP | 2013-251393 A | 12/2013 |
| JP | 2018-041857 A | 3/2018 |
| JP | 2018-085356 A | 5/2018 |
| WO | WO-2013/111542 A1 | 8/2013 |

* cited by examiner

*Primary Examiner* — Jay C Chang
*Assistant Examiner* — Mikka Liu
(74) *Attorney, Agent, or Firm* — Foley & Lardner LLP

(57) ABSTRACT

A light emitting device comprising: a light emitting element; a phosphor layer covering side surfaces and an upper surface of the light emitting element; a first light diffusion layer disposed lateral to the light emitting element with the phosphor layer interposed therebetween; a second light diffusion layer disposed on the phosphor layer and the first light diffusion layer; and a first light reflective layer disposed on the second light diffusion layer. A lower surface of the second light diffusion layer comprises a first lower surface portion facing an upper surface of the phosphor layer and a second lower surface portion facing an upper surface of the first light diffusion layer, and at least a part of the first lower surface portion is located lower than the second lower surface portion.

5 Claims, 6 Drawing Sheets

LIGHT EMITTING DEVICE

CROSS-REFERENCE TO RELATED APPLICATION

This application claims priority to Japanese Patent Application No. 2018-235655, filed on Dec. 17, 2018, the disclosure of which is hereby incorporated herein by reference in its entirety.

BACKGROUND

The present disclosure relates to a light emitting device and a method of manufacturing the same.

Light emitting devices using light emitting elements, such as light emitting diodes, have been widely used in recent years. One of the applications of light emitting devices is a backlight for a display device. The light emitting device used in the backlight is required to have a wide light distribution. For example, JP 2013-251393 A describes a light emitting device with a wide light distribution.

However, backlights for display devices have different configurations depending on their applications, and thereby light emitting devices used in the backlights may also be required to have different light distribution characteristics.

SUMMARY

Therefore, it is an object of certain embodiments described in the present disclosure to provide a light emitting device that can control the direction of light emitted from its side surfaces, and a method of manufacturing the same.

A light emitting device according to an embodiment of the present disclosure includes: a light emitting element; a phosphor layer covering side surfaces and an upper surface of the light emitting element; a first light diffusion layer disposed lateral to the light emitting element with the phosphor layer interposed therebetween; a second light diffusion layer disposed on the phosphor layer and the first light diffusion layer; and a first light reflective layer disposed on the second light diffusion layer, wherein a lower surface of the second light diffusion layer has a first lower surface portion facing an upper surface of the phosphor layer and a second lower surface portion facing an upper surface of the first light diffusion layer, and at least a part of the first lower surface portion is located lower than the second lower surface portion.

A method of manufacturing a light emitting device according to an embodiment of the present disclosure includes: disposing a frame body containing a light diffusing material, on or over an upper surface of a first support member to thereby divide the upper surface into one or more mounting regions surrounded by the frame body; respectively disposing the light emitting elements in the respective divided mounting regions; respectively forming phosphor layers to cover the light emitting elements in the respective divided mounting regions; forming a light diffusion layer to cover the frame body and the phosphor layers; forming a light reflective layer on the light diffusion layer; disposing a second support member on the light reflective layer; and removing the first support member and cutting the frame body on the second support member so as to form first light diffusion layers each of which is a part of the frame body with a predetermined thickness, around the phosphor layer.

According to certain embodiments of the light emitting device of the present disclosure, the direction of light emitted toward the side surfaces of the light emitting device can be controlled.

In addition, according to certain embodiments of the method of manufacturing a light emitting device of the present disclosure, the light emitting device capable of controlling the direction of light emitted toward the side surfaces thereof can be manufactured.

DETAILED DESCRIPTION

A light emitting device according to embodiments of the present disclosure will be described in detail below with reference to the accompanying drawings. However, the following embodiments are for illustrative purpose only, and thus the present disclosure is not limited to the embodiments below. The dimensions, materials, shapes, relative arrangements and the like of components described below are merely illustrative examples and are not intended to limit the scope of the present disclosure, unless otherwise specified. In addition, the size, shape, positional relationship, and the like of components illustrated in the respective figures may be exaggerated for clarity of the description.

Figure 1:
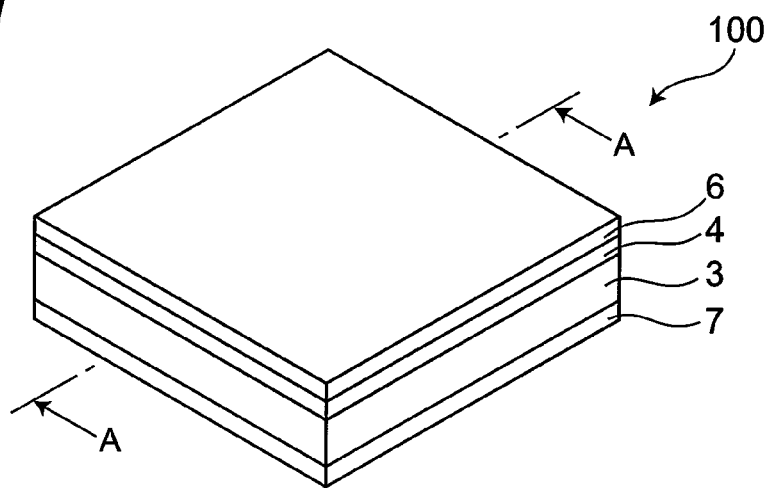
FIG. 1 is a perspective view of a light emitting device according to an embodiment as viewed from its upper surface.
Figure 2:
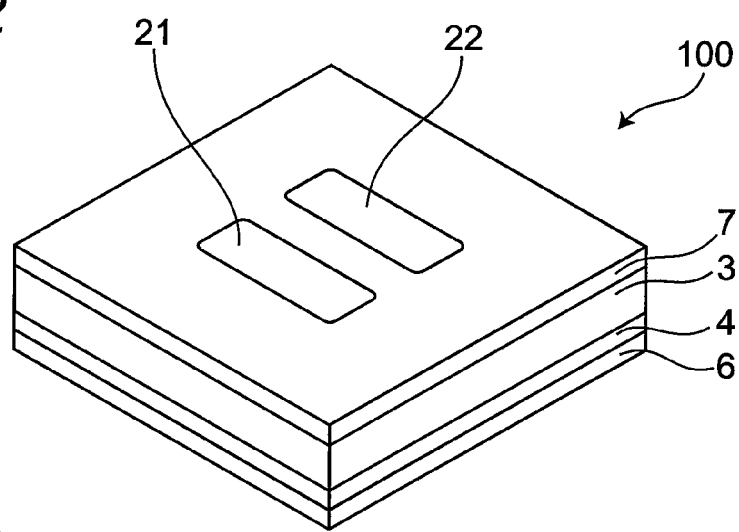
FIG. 2 is a perspective view of the light emitting device according to the embodiment as viewed from its lower surface.
Figure 3:
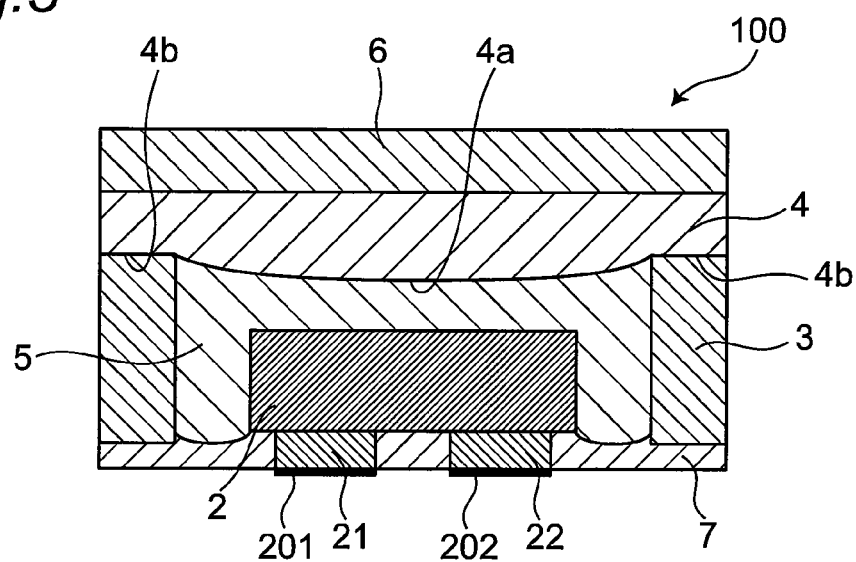
FIG. 3 is a cross-sectional view taken along line A-A of FIG. 1.
Figure 4:
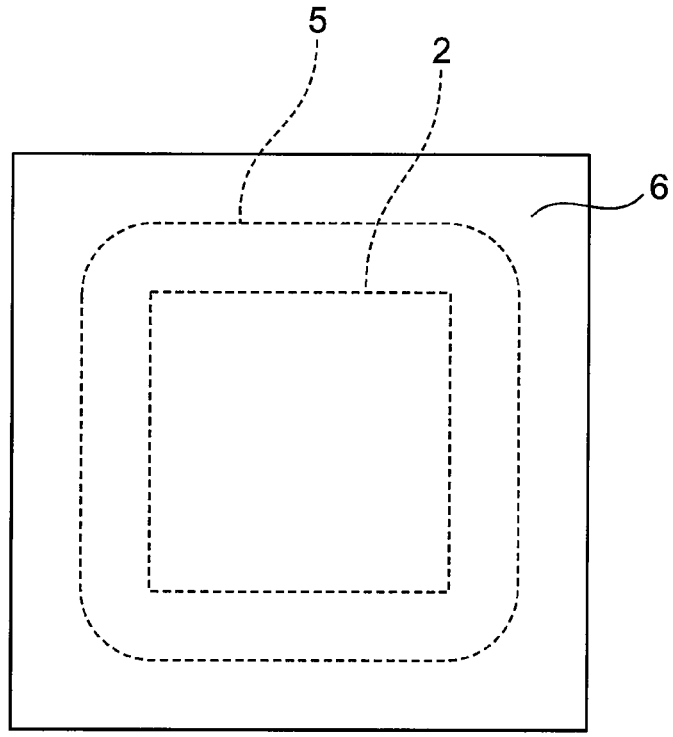
FIG. 4 is a top view of the light emitting device according to the embodiment.
Figure 5:
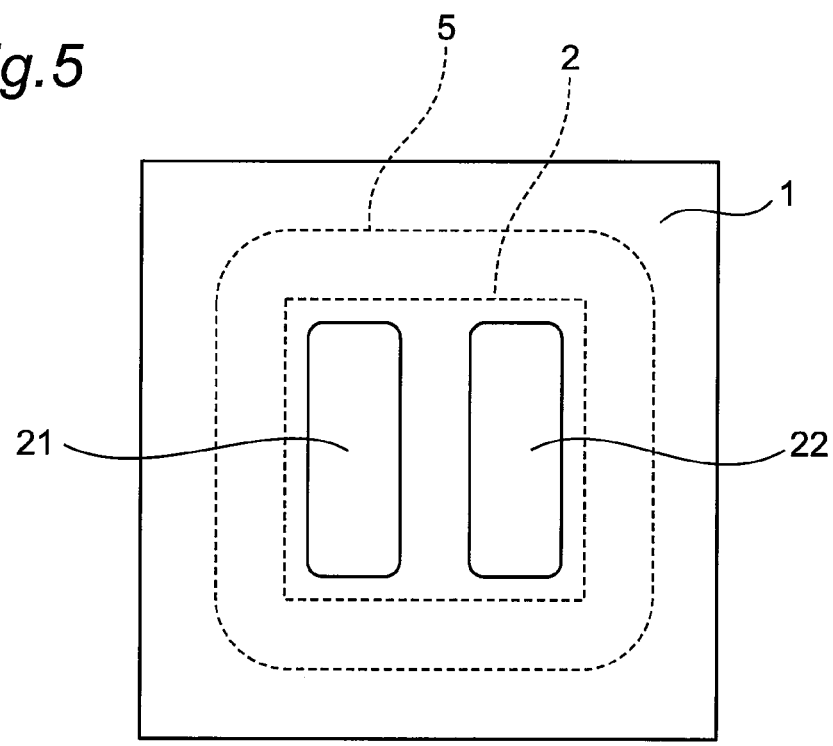
FIG. 5 is a bottom view of the light emitting device according to the embodiment.

A light emitting device 100 according to an embodiment of the present disclosure is shown in FIGS. 1 to 5. FIG. 1 is a perspective view of the light emitting device 100 as viewed from above; FIG. 2 is a perspective view of the light emitting device 100 as viewed from below; FIG. 3 is a cross-sectional view thereof; FIG. 4 is a top view of the light emitting device 100; and FIG. 5 is a bottom view of the light emitting device 100.

The light emitting device 100 according to the embodiment includes a second light reflective layer 7, a light emitting element 2 provided on the second light reflective layer 7, a first light diffusion layer 3 disposed on the second light reflective layer 7 so as to surround the light emitting element 2, a phosphor layer 5 provided inside the first light diffusion layer 3 so as to cover side surfaces and an upper surface of the light emitting element 2, a second light diffusion layer 4 disposed on the phosphor layer 5 and the first light diffusion layer 3, and a first light reflective layer 6 disposed on the second light diffusion layer 4.

In the light emitting device 100 according to the embodiment, the lower surface of the second light diffusion layer 4 includes a first lower surface portion 4a that faces an upper surface of the phosphor layer 5 and a second lower surface portion 4b that faces an upper surface of the first light diffusion layer 3. At least a part of the first lower surface portion 4a is located lower than the second lower surface portion 4b. In the light emitting device 100 according to the present embodiment shown in FIG. 3, the first lower surface portion 4a is a convex surface that protrudes downward such that substantially the entire first lower surface portion 4a is located lower than the second lower surface portion 4b, while the outer peripheral edge of the first lower surface portion 4a is located at the inner peripheral edge of the upper surface of the first light diffusion layer 3.

As described above, the light emitting device 100 according to the embodiment includes the first light reflective layer 6 and the second light reflective layer 7 on the upper surface side and the bottom surface side, respectively. The phosphor layer 5 is covered with either the first light diffusion layer 3 or the second light diffusion layer 4, between the first light reflective layer 6 and the second light reflective layer 7. Therefore, in the light emitting device 100 according to the embodiment, when the light emitting element 2 emits light, part or all of the light emitted from the light emitting element 2 (primary light) has its wavelength converted by the phosphor layer 5. Then, a combination of the primary light and the light whose wavelength is converted by the phosphor layer 5 (secondary light), or only the secondary light is emitted from the side surfaces of the first light diffusion layer 3 and the side surfaces of the second light diffusion layer 4.

In the light emitting device 100 with the above-described configuration according to the embodiment, the distribution characteristics of the light emitted from the side surfaces of the first light diffusion layer 3 and the side surfaces of the second light diffusion layer 4 are determined depending on the material and shape of the first light diffusion layers 3 and the material and shape of the side surface of the second light diffusion layer 4. In other words, in the light emitting device 100 according to the embodiment, the material and shape of the first light diffusion layers 3 and the material and shape of the side surface of the second light diffusion layer 4 and the like are set so as to emit the light with the desired light distribution characteristics from the side surfaces of the first light diffusion layer 3 and the side surfaces of the second light diffusion layer 4.

In particular, in the light emitting device 100 according to the embodiment, the lower surface of the second light diffusion layer 4 includes the first lower surface portion 4a and the second lower surface portion 4b, and additionally, at least a part of the first lower surface portion 4a is located lower than the second lower surface portion 4b. Thus, by simply modifying the shape of the first lower surface portion 4a, the light distribution characteristics of the light emitting device 100 can be adjusted. Because the shape of the first lower surface portion 4a can be modified without changing the outer shape of the light emitting device 100, a light emitting device with different light distribution characteristics can be manufactured only by changing a part of the conditions of the manufacturing process, which will be described below. Therefore, even when manufacturing many types of light emitting devices in small quantities (in the case of high-mix low-volume manufacturing), the light emitting devices can be manufactured at low cost.

The components of the light emitting device 100 according to the embodiment will be described below in detail.

(Light Emitting Element 2)

The light emitting element 2 usable in the light emitting device 100 according to the present embodiment is not particularly limited and may be a semiconductor light emitting element, such as a light emitting diode (LED). The light emitting element 2 has a pair of electrodes 21 and 22 on the same surface. When the electrodes 21 and 22 are made of a material that is susceptible to oxidation, such as Cu, the electrodes 21 and 22 preferably have metallic films 201 and 202 on their respective surfaces.

(Phosphor Layer 5)

The phosphor layer 5 converts part or all of the light from the light emitting element 2 (primary light) by a phosphor contained in a phosphor layer 8 to emit the light with a wavelength different from that of the primary light (secondary light). Thus, for example, the light emitting device 100 can emit a mixed light of the primary light whose wavelength has not been converted and the secondary light whose wavelength has been converted. It is noted that, in some embodiments, by adjusting the amount of the phosphor or the like, it is possible to emit only the secondary light, which is mainly composed of the wavelength-converted light, to the outside.

The phosphor layer 5 is a resin layer that has, for example, particles of the phosphor dispersed therein. The resin of the phosphor layer 5 is not particularly limited as long as it is a light transmissive resin. Examples of the resin of the phosphor layer 5 include a silicone resin, an epoxy resin, a phenol resin, a polycarbonate resin, an acrylic resin, and modified resins thereof. Examples of the phosphor include yttrium aluminum garnet activated with cerium, lutetium aluminum garnet activated with cerium, terbium aluminum garnet activated with cerium, nitrogen-containing calcium aluminosilicate activated with any one or two of europium and chromium, sialon activated with europium, silicate activated with europium, and potassium fluorosilicate activated with manganese. The phosphor layer 5 may contain one kind of phosphor or two or more different kinds of phosphors. The phosphor layer 5 may be a single layer or a laminated layer composed of a plurality of layers stacked one on top of the other.

(First Light Diffusion Layer 3)

The first light diffusion layer 3 is disposed on each side of the phosphor layer 5, and thereby the outer peripheral surfaces of the first light diffusion layer 3 constitute parts of the side surfaces of the light emitting device 100. The light exiting from the phosphor layer 5 is diffused in the first light diffusion layer 3. As a result, the first light diffusion layer 3 can efficiently emit the light from each phosphor layer 5 laterally.

The first light diffusion layer 3 contains a light diffusing material that diffuses light from the light emitting element 2. The first light diffusion layer 3 may be a resin layer in which particles of the light diffusing material are dispersed. The resin of the first light diffusion layer 3 is not particularly limited as long as it is a light transmissive resin. Examples of the resin of the first light diffusion layer 3 include a silicone resin, an epoxy resin, a phenol resin, a polycarbonate resin, an acrylic resin, and modified resins thereof. Examples of the light diffusing material suitable for use include silica, titanium oxide, silicon oxide, aluminum oxide, potassium titanate, zinc oxide, boron nitride, and the like, each of which has an average particle size (median diameter on a volume basis) in a range of approximately 0.1 µm to 30 µm. The content of the light diffusing material in the first light diffusion layer 3 may be in a range of 0.1 to 70% by weight based on the total weight of the first light diffusion layer 3.

(Second Light Diffusion Layer 4)

The second light diffusion layer 4 is disposed on the phosphor layer 5 and the first light diffusion layer 3, and thereby the outer peripheral surfaces of the second light diffusion layer 4 constitute parts of the side surfaces of the light emitting device 100. By providing the second light diffusion layer 4, the light extraction efficiency of the light emitting device 100 in the direction toward the side surfaces thereof can be improved. As shown in FIG. 3 and the like, the second light diffusion layer 4 can be disposed to face the upper surface of the first light diffusion layer 3. The second light diffusion layer 4 may be made of the same material as the first light diffusion layer 3. The first light diffusion layer 3 and the second light diffusion layer 4 may have the same composition or different compositions.

(First Light Reflective Layer 6)

The first light reflective layer 6 is disposed on the second light diffusion layer 4. The first light reflective layer 6 may be a layer that contains a light reflective material, and specifically a resin layer in which particles of the light reflective material are dispersed. The resin of the first light reflective layer 6 is not particularly limited. Examples of the resin of the first light reflective layer 6 include a silicone resin, an epoxy resin, a phenol resin, a polycarbonate resin, an acrylic resin, and modified resins thereof. Examples of the light diffusing material suitable for use include titanium oxide, zinc oxide, aluminum oxide, silicon oxide, potassium titanate, boron nitride, and the like, each of which has an average particle size (median diameter on a volume basis) of approximately 0.1 µm to 0.5 µm.

Instead of the above-described resin layer, a light reflective metal material can also be used in the first light reflective layer 6. For example, metals such as Ag, Al, Pt, Ti, Ni, Fe, W, Au, Cu, and Pd, alloys containing any of these metals can be used therein. Alternatively, a dielectric protective film may be used as the first light reflective layer 6. For example, a laminated film that includes $TiO_2$ and $SiO_2$ layers stacked one on top of the other can be used as the first light reflective layer 6. Instead of any of these materials, $Nb_2O_5$, $ZrO_2$, $Ta_2O_5$, etc., can also be used in the dielectric protective film. The lower surface of the first light reflective layer 6 (surface thereof in contact with the upper surface of the second light diffusion layer) can be an inclined surface or a curved surface, instead of the plane shown in FIG. 3. When the lower surface of the first light reflective layer 6 is an inclined surface or a curved surface, the lower surface is preferably positioned closest to substantially the center of the upper surface of the light emitting element 2. Thus, the light emitted upward from the upper surface of the light emitting element 2 can be easily reflected laterally by the lower surface of the first light reflective layer 6.

(Second Light Reflective Layer 7)

The second light reflective layer 7 is disposed to expose the respective electrodes 21 and 22 of the light emitting elements 2. With this configuration, the lower surface of the light emitting device 100 is constituted by the electrodes 21 and 22 and the second light reflective layer 7. By providing the second light reflective layer 7 at the lower surface of the light emitting device 100, the light extraction efficiency of the light emitting device 100 in the lateral direction can be further improved.

The second light reflective layer 7 can be also made of the same material as the first light reflective layer 6, but may be formed to have a light distribution ratio different from that of the first light reflective layer 6 regardless of whether using the material different from or similar to that of the first light reflective layer 6, so as to adjust the light distribution characteristics. The second light reflective layer 7 is preferably formed using a member with a high insulation because it is in contact with the electrodes 21 and 22 of the light emitting element 2.

The light emitting device 100 of the embodiment shown in FIG. 1 and the like has been described above to include the second light reflective layer 7 as one example configuration. However, the second light reflective layer 7 may be omitted from the light emitting device.

For example, even when the light emitting device not including the second light reflective layer 7 is mounted and used on a mounting substrate, the light from the light emitting element 2 and the light from the phosphor layer 5 are reflected by the mounting substrate. Consequently, the light can be emitted from the side surfaces of the light emitting device with desired light distribution characteristics, in the same manner as the light emitting device 100 including the second light reflective layer 7.

The light emitting device 100 of the embodiment shown in FIG. 1 and the like has been described above as an example of having the first lower surface portion 4a that is a convex surface that protrudes downward.

However, in the light emitting device of the present disclosure, the first lower surface portion 4a is not limited to the convex surface that protrudes downward. For example, the first lower surface portion 4a may be, for example, a flat surface with a concave portion partially formed therein. That is, in the light emitting device of the present disclosure, at least a part of the first lower surface portion 4a may be located lower than the second lower surface portion 4b that faces the upper surface of the first light diffusion layer 3, thereby allowing the light to be diffused at the interface to the first lower surface portion 4a.

Figure 7:
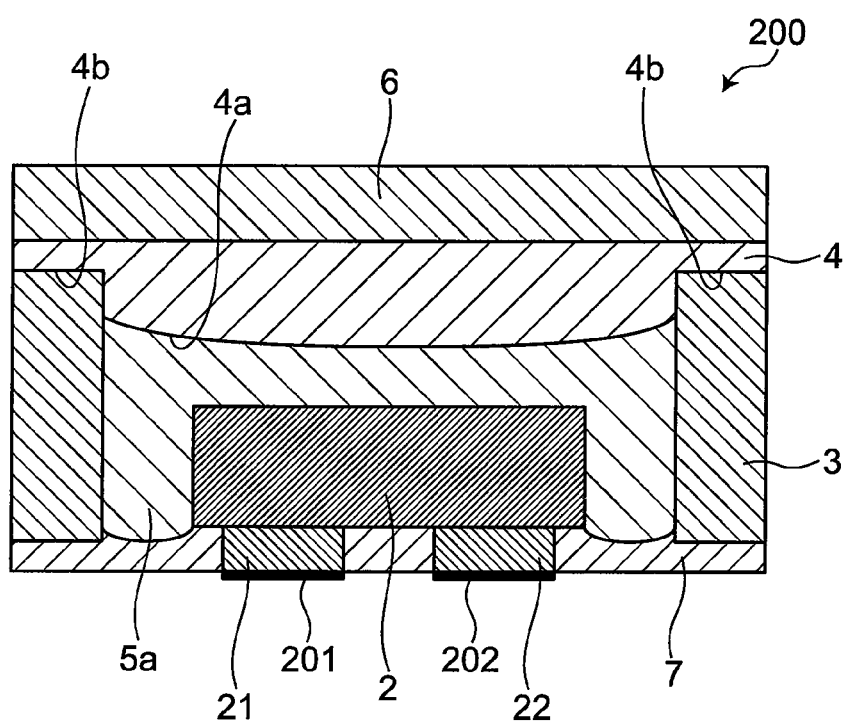
FIG. 7 is a cross-sectional view of a light emitting device according to a modification.

The light emitting device 100 of the embodiment shown in FIG. 1 and the like has been described above as an example in which the outer peripheral end of the first lower surface portion 4a is located at the inner peripheral end of the second lower surface portion 4b. However, as shown in a modification of FIG. 7, the outer peripheral end of the first lower surface portion 4a may be located lower than the inner peripheral end of the second lower surface portion 4b.

(Method of Manufacturing Light Emitting Device)

A method of manufacturing a light emitting device according to an embodiment will be described below with reference to FIGS. 6A to 6M. The method of manufacturing the light emitting device 100 is not limited to the method described below.

1. Frame Body Disposing Step

In a frame body disposing step, a frame body containing a light diffusing material is disposed on an upper surface of a first support member 91, thereby dividing the upper surface of the first support member 91 into one or more mounting regions surrounded by the frame body. Here, the frame body is a member constituting the first light diffusion layer 3 when a wafer is singulated into individual light emitting devices. In FIGS. 6A to 6M, the frame body is also denoted by reference numeral 3, which is the same as that for the first light diffusion layer.

Figure 6A:
FIG. 6A is a schematic cross-sectional view showing a step in a method of manufacturing a light emitting device according to an embodiment.

Specifically, first, the frame body 3 is prepared (see FIG. 6A). The frame body 3 can be fabricated, for example, by compression molding of a resin that contains a predetermined concentration of the light diffusing material. The thickness (height) of the frame body 3 can be adjusted by grinding or the like. Such a frame body 3 may be prepared through the above-described processes or by purchasing a preformed frame body.

Figure 6B:
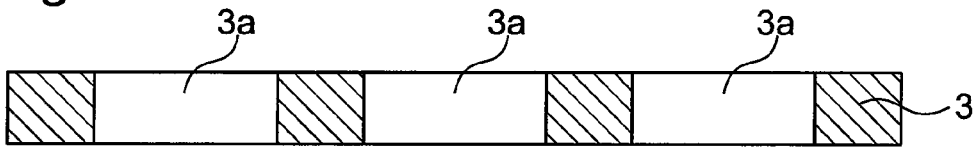
FIG. 6B is a schematic cross-sectional view showing another step in the method of manufacturing a light emitting device according to the embodiment.
Figure 6C:
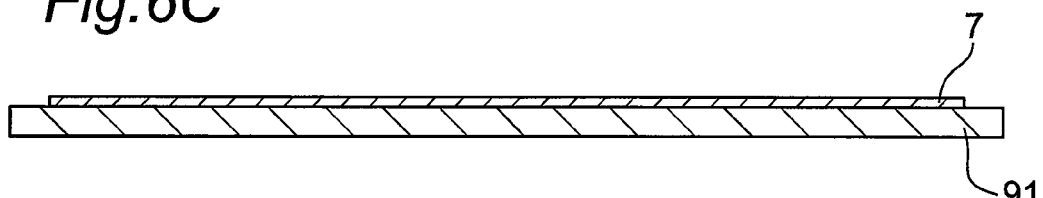
FIG. 6C is a schematic cross-sectional view showing another step in the method of manufacturing a light emitting device according to the embodiment.

Then, as shown in FIG. 6B, holes 3a are formed in the frame body 3 by punching or the like. Each hole 3a is provided to correspond to a region where the light emitting element 2 is disposed.

The first support member 91 is prepared concurrently with the preparation of the frame body 3.

In the case of manufacturing a light emitting device 100 that includes the second light reflective layer 7 under the light emitting element 2, as shown in FIG. 1, the second light reflective layer 7 is formed on the first support member 91, such as a support tape. The second light reflective layer 7 can be fabricated by applying a resin paste containing a predetermined concentration of a light reflective material onto the first support member 91 (see FIG. 6C). Alternatively, a preformed second light reflective layer 7 may be disposed on the first support member 91.

Figure 6D:
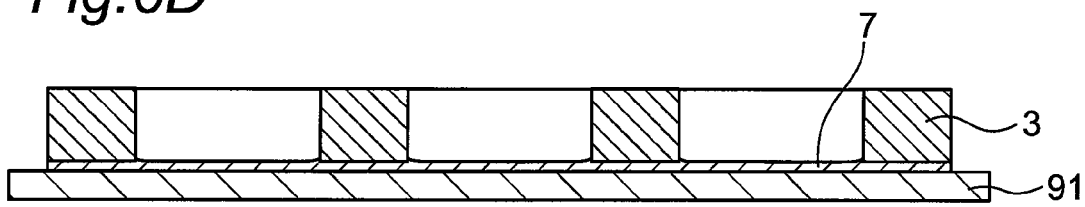
FIG. 6D is a schematic cross-sectional view showing another step in the method of manufacturing a light emitting device according to the embodiment.

As shown in FIG. 6D, the frame body 3 with the holes 3a formed therein is placed on the first support member 91 or over the first support member 91 via the second light reflective layer 7.

In the way described above, the upper surface of the first support member 91 is divided into one or two or more mounting regions that correspond to the respective holes 3a of the frame body 3.

Although FIGS. 6A to 6M show an example of manufacturing the light emitting device 100 including the second light reflective layer 7, the second light reflective layer 7 may be provided as needed, as described above.

2. Light Emitting Element Disposing Step

Each of the light emitting elements is disposed in the corresponding divided mounting region on the first support member 91 or over the first support member 91 via the second light reflective layer 7.

Figure 6E:
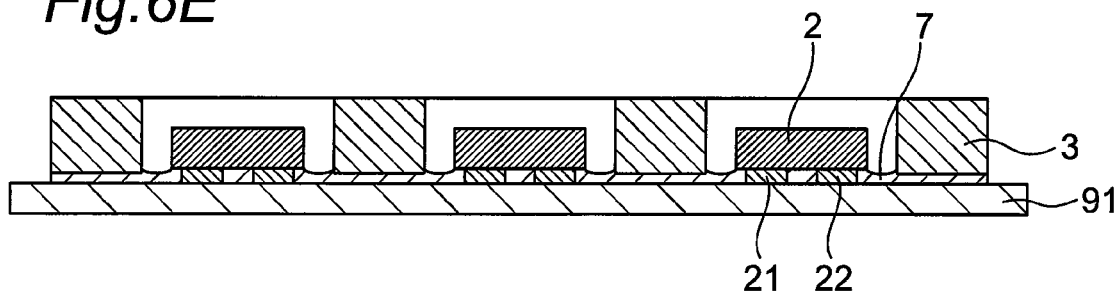
FIG. 6E is a schematic cross-sectional view showing another step in the method of manufacturing a light emitting device according to the embodiment.

Specifically, the light emitting element 2 is disposed inside the hole 3a (see FIG. 6E). In the case of forming the second light reflective layer 7 by applying a resin paste, the light emitting elements 2 are disposed such that the electrodes 21 and 22 of the light emitting elements 2 come into contact with the base 91 through the resin paste before curing the resin paste. Alternatively, in the case of disposing the formed second light reflective layer 7 on the base 91, for example, through holes are formed in the second light reflective layer 7 in advance such that the electrodes 21 and 22 are in contact with the base 91 before disposing the light emitting elements 2.

3. Phosphor Layer Formation Step

Here, the phosphor layers 5 are formed in the divided mounting regions to cover the light emitting elements 2.

Figure 6F:
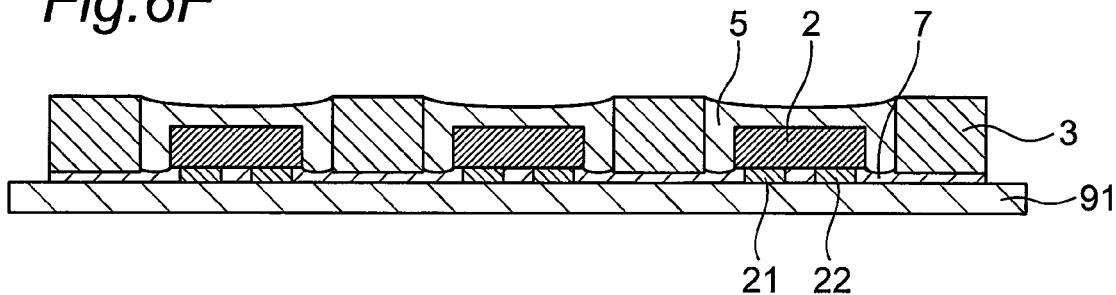
FIG. 6F is a schematic cross-sectional view showing another step in the method of manufacturing a light emitting device according to the embodiment.

Specifically, as shown in FIG. 6F, each of the phosphor layers 5 is formed in the mounting region by potting with the resin paste containing the predetermined concentration of the phosphor, into the hole 3a so as to cover the corresponding light emitting element 2. During the potting, the viscosity and injection amount of the resin paste are adjusted such that the resin paste is formed to have a desired warped concave portion on its upper surface when cured while covering the light emitting element 2 inside the hole 3a. In addition, by adjusting the viscosity and injection amount of the resin paste during the potting, the resin paste can be wetted and spread up to the upper end of the inner peripheral side surface of the first light diffusion layer 3 or towards the upper end of the inner peripheral side surface of the first light diffusion layer 3.

4. Light Diffusion Layer Formation Step

The second light diffusion layer 4 is formed to cover the frame body 3 and the phosphor layers 5.

Figure 6G:
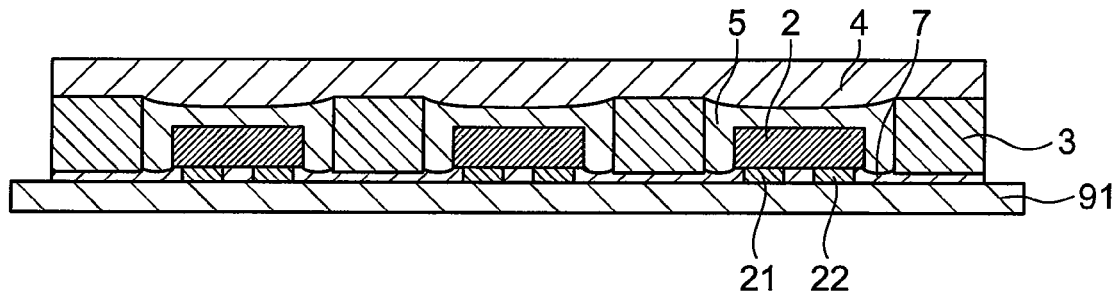
FIG. 6G is a schematic cross-sectional view showing another step in the method of manufacturing a light emitting device according to the embodiment.
Figure 6H:
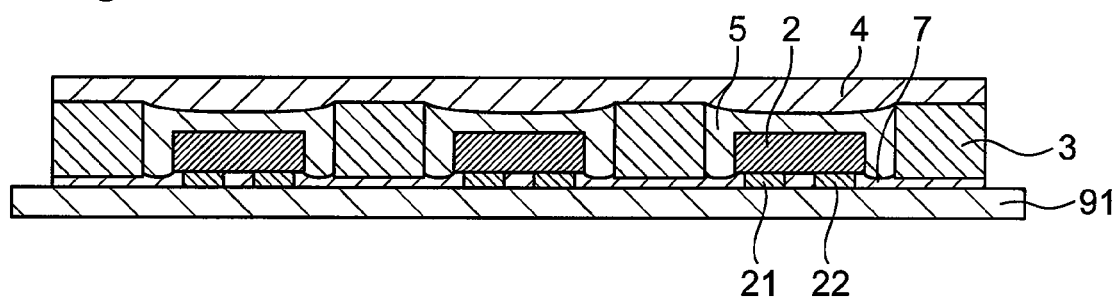
FIG. 6H is a schematic cross-sectional view showing another step in the method of manufacturing a light emitting device according to the embodiment.

Specifically, the second light diffusion layer 4 is formed, for example, by compression molding of the resin containing the predetermined concentration of the light diffusing material, on the first light diffusion layer 3 and the phosphor layers 5 (see FIG. 6G). The thickness of the second light diffusion layer 4 can be adjusted by grinding or the like (see FIG. 6H).

5. Light Reflective Layer Formation Step

The first light reflective layer 6 is formed on the second light diffusion layer 4.

Figure 6I:
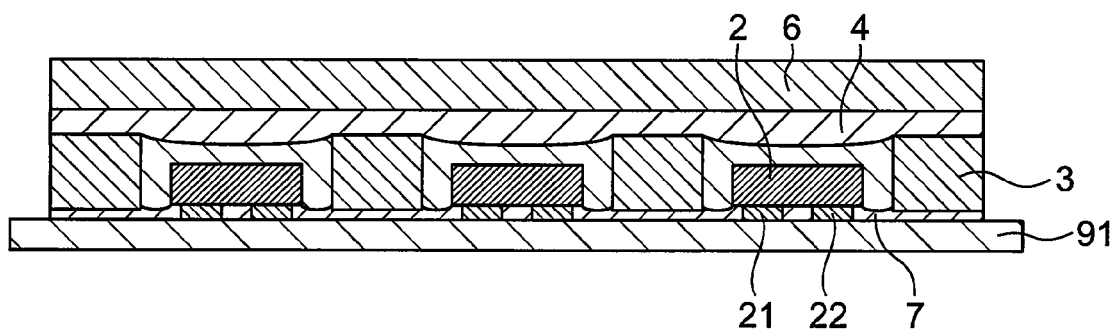
FIG. 6I is a schematic cross-sectional view showing another step in the method of manufacturing a light emitting device according to the embodiment.
Figure 6J:
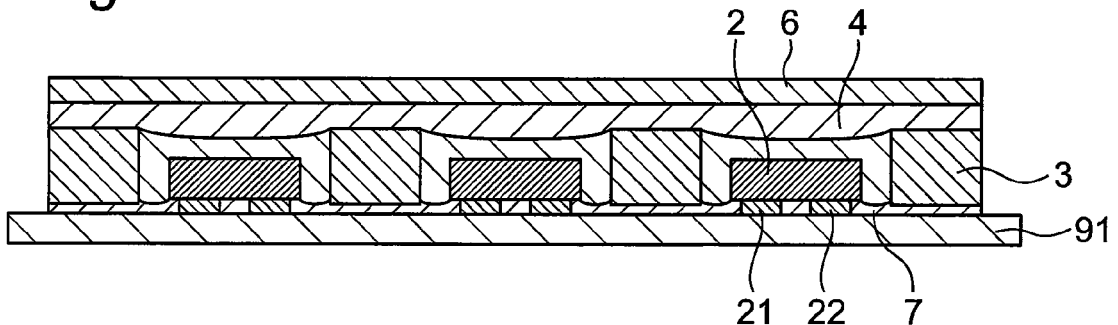
FIG. 6J is a schematic cross-sectional view showing another step in the method of manufacturing a light emitting device according to the embodiment.

Specifically, the first light reflective layer 6 is formed by compression molding of the resin containing the predetermined concentration of the light reflective material, on the second light diffusion layer 4 (see FIG. 6I). The thickness of the first light reflective layer 6 can be adjusted by grinding or the like (see FIG. 6J).

6. Second Support Member Disposing Step

A second support member 92 is disposed on the first light reflective layer 6.

Figure 6K:
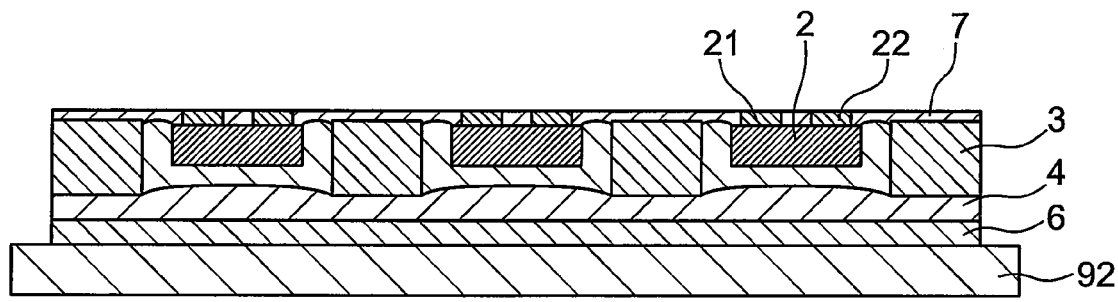
FIG. 6K is a schematic cross-sectional view showing another step in the method of manufacturing a light emitting device according to the embodiment.
Figure 6L:
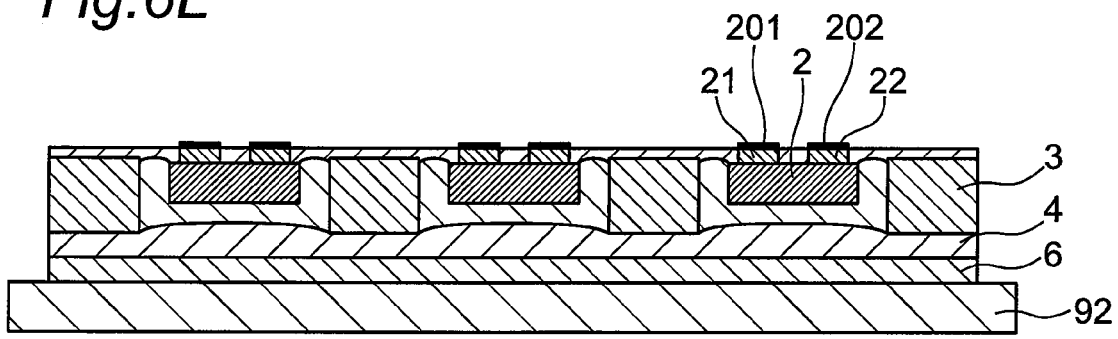
FIG. 6L is a schematic cross-sectional view showing another step in the method of manufacturing a light emitting device according to the embodiment.

Specifically, after joining the first light reflective layer 6 to the second support member 92, such as a support tape, the first support member 91 is removed to thereby transfer the light emitting elements from the first support member 91 to the second support member 92 (see FIG. 6K). Then, burrs of the second light reflective layer 7 on the electrodes 21 and 22 are removed as needed to expose the electrodes 21 and 22 of the light emitting element 2 (see FIG. 6K). When the electrodes 21 and 22 are made of material that are susceptible to oxidation, such as Cu, metallic films 201 and 202 are preferably formed on the surfaces of the electrodes 21 and 22, respectively, by sputtering or the like (see FIG. 6L).

7. Cutting Step

Figure 6M:
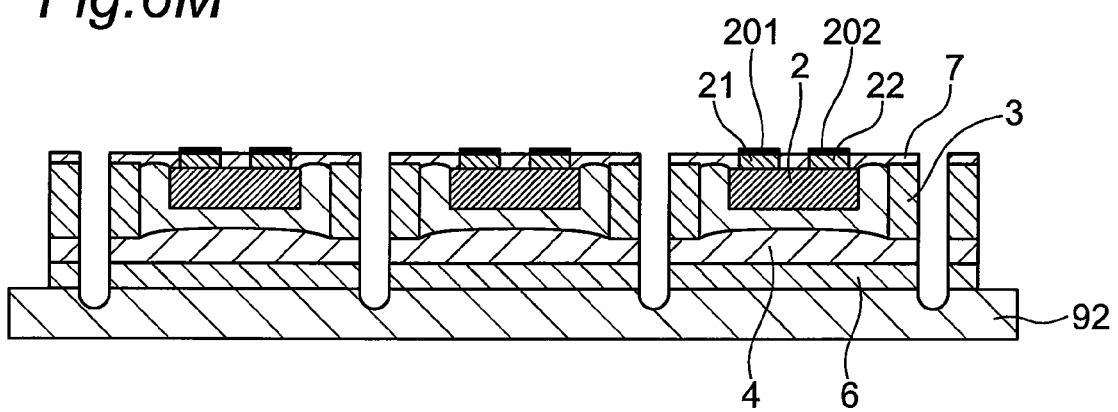
FIG. 6M is a schematic cross-sectional view showing another step in the method of manufacturing a light emitting device according to the embodiment.

The frame body 3 is cut on the second support member 92 so as to leave a part of the frame body 3 with a predetermined thickness, around the phosphor layer 5 formed in each mounting region (see FIG. 6M).

Thus, the light emitting device 100 or 200 according to the embodiment can be manufactured. Similarly, the light emitting device not to include the second light reflective layer can also be manufactured.

According the method of manufacturing a light emitting device in the above-described embodiment, light emitting devices with different light distribution characteristics can be manufactured by simply changing a part of the conditions of the manufacturing process, as described below.

For example, in the phosphor layer formation step, after performing the processes from the frame body disposing step to the light emitting element disposing step under the same conditions, by changing a phosphor content and/or viscosity and injection of the above-described resin paste containing the phosphor, the degree of warping of the phosphor layer surface can be changed, thus making it possible to change the light distribution characteristics of the light emitting devices.

In the phosphor layer formation step, by changing the phosphor content and/or viscosity and injection amount of the above-described resin paste containing the phosphor, the resin paste can be wetted and spread up to the upper end of the inner peripheral side surface of the first light diffusion layer 3 or towards the upper end of the inner peripheral side surface of the first light diffusion layer 3. This makes it possible to change the light distribution characteristics of the light emitting device.

In the light diffusion layer formation step, by adjusting the thickness of the second light diffusion layer 4, the light distribution characteristics of the light emitting device can be changed.

Further, in the cutting step, by adjusting the thickness of the frame body 3 left around the phosphor layer 5 formed in each mounting region, the light distribution characteristics of the light emitting device can also be changed.

Therefore, the method of manufacturing a light emitting device according to the embodiment can allow for manufacturing the side-emission light emitting devices with the desired light distribution characteristics at low cost, even in the case of high-mix low-volume manufacturing.

The light emitting device according to the present disclosure can be used in a wide variety of applications, such as backlights of display devices.

What is claimed is:

1. A light emitting device comprising:
   a light emitting element having an upper surface, a lower surface, and lateral surfaces extending from the upper surface to the lower surface;
   a phosphor layer covering the upper surface and the lateral surfaces of the light emitting element;
   a first light diffusion layer surrounding the lateral surfaces of the light emitting element such that the phosphor layer is interposed between the first light diffusion layer and the lateral surfaces of the light emitting element;
   a second light diffusion layer disposed on an upper surface of the phosphor layer and an upper surface of the first light diffusion layer; and
   a first light reflective layer disposed on an upper surface of the second light diffusion layer,
   wherein a lower surface of the second light diffusion layer comprises a first lower surface portion facing the upper surface of the phosphor layer and a second lower surface portion facing the upper surface of the first light diffusion layer, and at least a part of the first lower surface portion is located lower than the second lower surface portion.

2. The light emitting device according to claim 1, further comprising a second light reflective layer under the light emitting element.

3. The light emitting device according to claim 1, wherein at least a part of the first lower surface portion is convex and protrudes downward.

4. The light emitting device according to claim 1, wherein an outer peripheral end of the first lower surface portion is located at an inner peripheral end of the second lower surface portion.

5. The light emitting device according to claim 1, wherein an outer peripheral end of the first lower surface portion is located lower than an inner peripheral end of the second lower surface portion.

* * * * *